United States Patent
Ibok

(10) Patent No.: US 6,444,555 B2
(45) Date of Patent: *Sep. 3, 2002

(54) METHOD FOR ESTABLISHING ULTRA-THIN GATE INSULATOR USING ANNEAL IN AMMONIA

(75) Inventor: Effiong Ibok, Sunnyvale, CA (US)

(73) Assignee: Advanced Micro Devices, Inc., Sunnyvale, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 61 days.

(21) Appl. No.: 09/479,506

(22) Filed: Jan. 7, 2000

Related U.S. Application Data
(60) Provisional application No. 60/169,540, filed on Dec. 7, 1999.

(51) Int. Cl.[7] .................. H01L 21/3205; H01L 21/31; H01L 21/469
(52) U.S. Cl. .............. 438/591; 438/783; 438/786
(58) Field of Search ................ 438/591, 783, 438/786, 778, 585, 765; 257/411

(56) References Cited

U.S. PATENT DOCUMENTS

| | | | |
|---|---|---|---|
| 4,490,900 A | 1/1985 | Chiu | 29/571 |
| 5,017,979 A | 5/1991 | Fujii et al. | 357/23.5 |
| 5,219,773 A | 6/1993 | Dunn | 437/42 |
| 5,254,489 A | 10/1993 | Nakata | 437/40 |
| 5,656,516 A | 8/1997 | Suzuki | 437/773 |
| 5,891,809 A | * 4/1999 | Chau et al. | 438/770 |
| 5,908,313 A | * 6/1999 | Chau et al. | 438/299 |
| 6,048,769 A | * 4/2000 | Chau | 438/275 |
| 6,107,174 A | 8/2000 | Hori | 438/585 |
| 6,124,171 A | * 9/2000 | Arghavani et al. | 438/286 |
| 6,133,093 A | * 10/2000 | Prinz et al. | 438/257 |

FOREIGN PATENT DOCUMENTS

EP 0847079 A2 10/1998 .......... H01L/21/28

OTHER PUBLICATIONS

The article by Gupta et al. entitled, "Hot–carrier–induced degradation in nitrided oxide MOSFET's" in IEEE Transactions on Electron Devices, vol. 36(3), Mar. 3, 1989, pp. 577–588.*

Effect of Nittrogen Distribution in Nitrided Oxide prepared by Rapid Thermal Annealing on its Electrical Characteristics/Yasushi Naito, Takashi Hori, Hiroshi Iwasaki, and Hideya Esaki, pp. 633–637.

* cited by examiner

Primary Examiner—Olik Chaudhuri
Assistant Examiner—Erik Kielin
(74) Attorney, Agent, or Firm—LaRiviere, Grubman & Payne, LLP

(57) ABSTRACT

A method for fabricating a semiconductor device including a silicon substrate includes forming a thin Oxide base film on a substrate, and then annealing the substrate in ammonia. FET gates are then conventionally formed over the gate insulator. The resultant gate insulator is electrically insulative without degrading performance with respect to a conventional gate oxide insulator.

3 Claims, 1 Drawing Sheet

METHOD FOR ESTABLISHING ULTRA-THIN GATE INSULATOR USING ANNEAL IN AMMONIA

CROSS-REFERENCE TO RELATED APPLICATION

This continued prosecution application claims the benefit of U.S. Nonprovisional Patent Application Serial No. 09/479,506, entitled "METHOD FOR ESTABLISHING ULTRA-THIN GATE INSULATOR USING ANNEAL IN AMMONIA," filed on Jan. 7, 2000, in turn, claiming the benefit of U.S. Provisional Patent Application Serial No. 60/169,540, also entitled "METHOD FOR ESTABLISHING ULTRA-THIN GATE INSULATOR USING ANNEAL IN AMMONIA," filed on Dec. 7, 1999.

TECHNICAL FIELD

The present invention relates to the fabrication of semiconductor devices, and more particularly to establishing field effect transistor (FET) gate insulators.

BACKGROUND OF THE INVENTION

Semiconductor chips or wafers are used in many applications, including as integrated circuits and as flash memory for hand held computing devices, wireless telephones, and digital cameras. Regardless of the application, it is desirable that a semiconductor chip hold as many circuits or memory cells as possible per unit area. In this way, the size, weight, and energy consumption of devices that use semiconductor chips advantageously is minimized, while nevertheless improving the memory capacity and computing power of the devices.

It can readily be appreciated that it is important to electrically isolate various components of an integrated circuit from each other, to ensure proper circuit operation. As one example, in a transistor, a gate is formed on a semiconductor substrate, with the gate being insulated from the substrate by a very thin dielectric layer, referred to as the "gate oxide" or "gate insulator". As the scale of semiconductor devices decreases, the thickness of the gate insulator layer likewise decreases.

As recognized herein, at very small scales, the gate insulator can be become so thin that otherwise relatively small encroachments into the gate insulator layer by sub-oxides from the substrate and from adjacent polysilicon connector electrodes can reduce the insulating ability of the gate insulator layer. This poses severe problems because under these circumstances, even very minor defects in the substrate can create electron leakage paths through the gate insulator, leading to catastrophic failure of the transistor.

To circumvent this problem, alternatives to traditional gate oxide materials, such as high-k dielectric materials including nitrides and oxynitrides that can be made very thin and still retain good insulating properties, have been proposed. Unfortunately, it is thought that these materials can degrade the performance of the transistor. Nitride, in particular, has been considered undesirable because it promotes unwanted leakage of electrons through the gate insulator layer.

Furthermore, as the gate insulator layer becomes very thin, e.g., on the order of nineteen Angstroms (19 Å), device integration becomes highly complicated. Specifically, it is necessary to etch portions of the polysilicon electrodes down to the substrate, but stopping the etch on a very thin, e.g., 19 Å gate insulator layer without pitting the substrate underneath becomes problematic. Accordingly, the present invention recognizes that it is desirable to provide a gate insulator layer that can be made very thin as appropriate for very small-scale transistors while retaining sufficient electrical insulation properties to adequately function as a gate insulator, and while retaining sufficient physical thickness to facilitate device integration, without degrading performance vis-a-vis oxide insulators.

BRIEF SUMMARY OF THE INVENTION

A method for making a semiconductor device includes providing a semiconductor substrate, and establishing an oxide base film on the substrate. The substrate is annealed, preferably in ammonia at temperatures up to eleven hundred degrees Celsius (1100° C.), after which FET gates are formed on portions of the film. The preferred base film defines a thickness of no more than twenty four Angstroms (24 Å). However, after annealing, the base film has been converted to a nitrided oxide film having electrically insulating properties which correspond to that of a thinner conventional oxide film having a physical thickness of only 20 Å thick to inhibit undesired tunneling through the nitrided oxide film, thereby resulting in a relatively lower standby current for a relatively higher drive current and capacitance.

Other features of the present invention are disclosed or apparent in the section entitled

DETAILED DESCRIPTION OF THE INVENTION

BRIEF DESCRIPTION OF DRAWINGS

For understanding of the present invention, reference is made to the accompanying drawing in the following DETAILED DESCRIPTION OF THE INVENTION. In the drawings.

DETAILED DESCRIPTION OF THE INVENTION

The principles of the present invention are equally applicable to a wide range of semiconductor and integrated circuit design and manufacture regimens, including but not necessarily limited to the production of non-volatile memory devices. All such implementations are specifically contemplated by the principles of the present intention.

Figure 1:
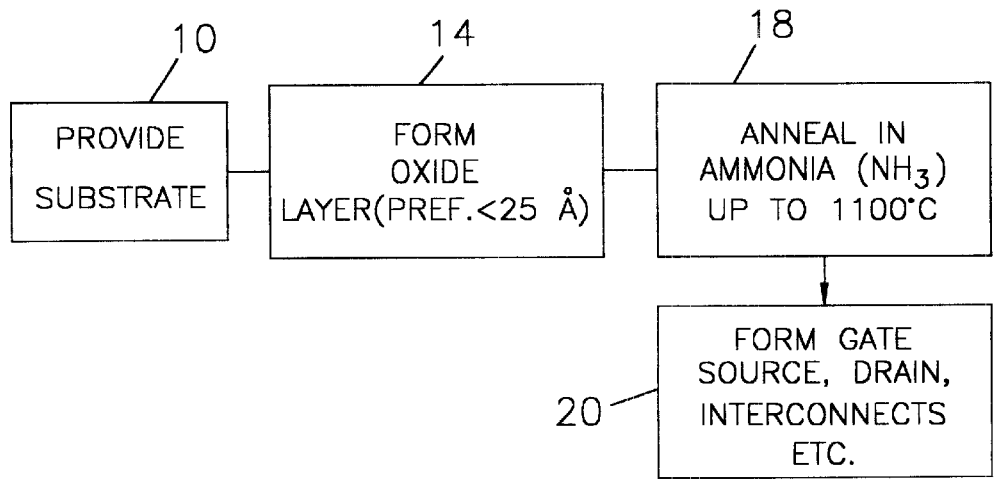
FIG. 1 is a flow chart of the manufacturing process.
Figures 2, 3:
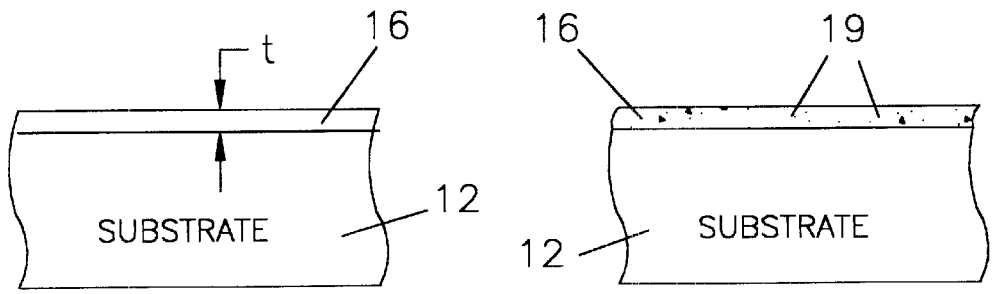
FIG. 2 is a side view of the device after forming the base film on the substrate.
FIG. 3 is a side view of the device after annealing the base film.

Referring initially to FIGS. 1 and 2, at block 10 in FIG. 1 a semiconductor substrate 12 (FIG. 2) such as Silicon is provided, and then at block 14 a thin Oxide base film 16 is grown on the substrate 12 in accordance with oxide film formation principles known in the art, in direct contact with the substrate 12. The thickness "t" of the base film 16 is no more than twenty four Angstroms (24 Å).

Moving to block 18 of FIG. 1 and referring to FIG. 3, the substrate 12 with film 16 is annealed in situ in ammonia ($NH_3$) at a temperature of up to eleven hundred degrees Celsius (1100° C.) to establish a Nitrogen concentration in the base film 16, thereby forming the nitrided oxide film. The Nitrogen is represented by the dots 19. In accordance with present principles, after annealing, the electrically insulating properties of the nitrided oxide film corresponds to that of a thinner conventional oxide film having a physical thickness of only 20 Å thick (yet having a physical thickness nearly equal to the film 16 prior to annealing) to inhibit undesired tunneling through the nitrided oxide film, thereby resulting in a relatively lower standby current for a relatively higher drive current and capacitance.

Figure 4:
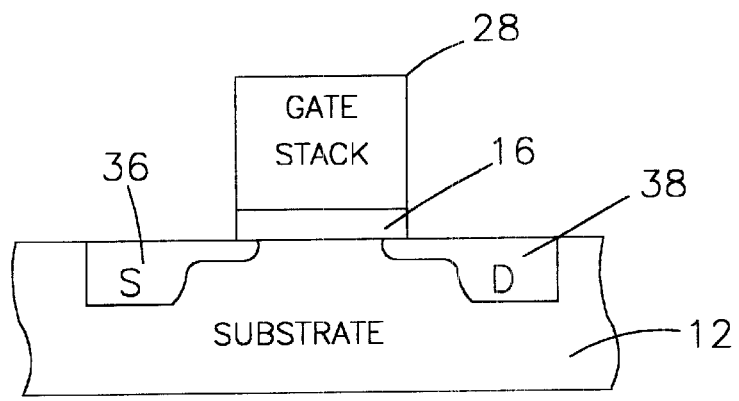
FIG. 4 is a side view of the device after forming the FET gate stacks on the nitride film.

Next, at block 20 in FIG. 2 and referring now to FIG. 4, a polysilicon-based field effect transistor (FET) stack 28 is formed on the reduced-hydrogen nitrided oxide film, the nitrided oxide film having been converted from the film 16, in accordance with FET gate stack deposition and patterning principles known in the art. After forming and patterning the FET stacks 28, the process is completed by forming FET sources and drains 36, 38 using conventional principles, and contacts, interconnects, and FET to FET insulation are likewise conventionally undertaken.

With the above disclosure in mind, the ammonia anneal of the oxide base film effects the equivalent "electrical thickness" (i.e., electrically insulating properties) of a thinner oxide base film in the formed reduced-hydrogen nitrided oxide film. In other words, for a film that is sufficiently thick for the above-mentioned structural considerations, e.g., 24 Å thick, after annealing, the film advantageously behaves electrically like a film that is only 20 Å thick. This, in turn, advantageously decreases subsequent electron tunneling through the reduced-hydrogen nitrided oxide film, thereby resulting in a lower standby current for higher drive current an capacitance, compared to a film which has not been annealed in ammonia.

The present invention has been particularly shown and described with respect to certain preferred embodiments of features thereof. However, it should be readily apparent to those of ordinary skill in the art that various changes and modifications in form and detail may be made without departing from the spirit and scope of the invention as set forth in the appended claims. In particular, the use of: alternate layer deposition or forming methodologies; etching technologies; masking methods; lithographic methods, passivation and nitridization techniques; as well as alternative semiconductor designs, as well as the application of the technology disclosed herein to alternate electronic components are all contemplated by the principles of the present invention. The invention disclosed herein may be practiced without any element which is not specifically disclosed herein. The use of the singular in the claims does not mean "only one", but rather "one or more", unless otherwise stated in the claims.

What is claimed is:

1. A method for making a semiconductor device, having an ultra-thin insulator for inhibiting tunneling effects, said method comprising:

providing a semiconductor substrate;

establishing an oxide base film on the substrate, said oxide base film having an oxide base film thickness, wherein said step of establishing the oxide base film comprises said oxide film thickness being in the range of no more than twenty-four Angstroms ($\leq 24$ Å);

annealing the oxide base film on the substrate in an ammonia ($NH_3$) environment in a temperature range of up to eleven hundred degrees Celsius (1100° C.), thereby forming a nitrided oxide film, wherein the step of annealing reduces the effective electrical thickness of the nitrided oxide film to twenty Angstroms (20 Å), said nitrided oxide film having a nitrided oxide film thickness being relative to said oxide base film thickness for facilitating inhibition of said tunneling effects, thereby resulting in a lower standby current for a higher drive current and capacitance, for facilitating function as a gate insulator, and for facilitating integration of said device, said nitrided oxide film having electrically insulating properties equal to that of an oxide film thinner than said oxide base film thickness, and said ultra-thin insulator comprising said nitrided oxide film; and forming at least one polysilicon-based field effect transistor (FET) gate on at least one portion of the nitrided oxide film.

2. A method, as recited in claim 1, wherein the step of annealing decreases subsequent electron tunneling through the nitride oxide film, thereby resulting in a lower standby current for higher drive current and capacitance than the oxide base film would have.

3. A method for making a semiconductor device, having an ultra-thin insulator for inhibiting tunneling effects, said method comprising:

providing a semiconductor substrate;

establishing an oxide base film on the substrate, said oxide base film having an oxide base film thickness;

annealing the oxide base film on the substrate in an ammonia ($NH_3$) environment in a temperature range of up to eleven hundred degrees Celsius (1100° C.), thereby forming a nitrided oxide film, said nitrided oxide film having a nitrided oxide film thickness being relative to said oxide base film thickness, said nitrided oxide film having electrically insulating properties equal to that of an oxide film thinner than said oxide base film thickness, and said ultra-thin insulator comprising said nitrided oxide film; and forming at least one polysilicon-based field effect transistor (FET) gate at least one portion of the nitrided oxide film, wherein said step of establishing the oxide base film comprises said oxide film thickness being in a range of no more than twenty-four Angstroms ($\leq 24$ Å), wherein the step of annealing reduces an effective electrical thickness of the nitrided oxide film, wherein the step of annealing reduces the effective electrical thickness of the nitrided oxide film to twenty Angstroms (20 Å), and wherein the step of annealing decreases subsequent electron tunneling through the nitrided oxide film, thereby resulting in a lower standby current for higher drive current and capacitance than the oxide base film would have.

* * * * *